(12) United States Patent
Kim et al.

(10) Patent No.: US 8,350,795 B2
(45) Date of Patent: Jan. 8, 2013

(54) THIN FILM TRANSISTOR DISPLAY PANEL

(75) Inventors: Dong-Gyu Kim, Yongin-si (KR); Hyun-Ho Kang, Ansan-si (KR)

(73) Assignee: Samsung Display Co., Ltd. (KR)

( * ) Notice: Subject to any disclaimer, the term of this patent is extended or adjusted under 35 U.S.C. 154(b) by 339 days.

(21) Appl. No.: 12/621,415

(22) Filed: Nov. 18, 2009

(65) Prior Publication Data
US 2010/0289733 A1 Nov. 18, 2010

(30) Foreign Application Priority Data
Mar. 11, 2009 (KR) .................. 10-2009-0020754

(51) Int. Cl.
G09G 3/36 (2006.01)
(52) U.S. Cl. .................. 345/92; 345/204; 345/214
(58) Field of Classification Search .................. None
See application file for complete search history.

(56) References Cited

U.S. PATENT DOCUMENTS

| | | | | |
|---|---|---|---|---|
| 7,532,269 B2* | 5/2009 | Ahn | | 349/43 |
| 7,859,628 B2* | 12/2010 | Park et al. | | 349/141 |
| 7,920,219 B2* | 4/2011 | Jun et al. | | 349/38 |
| 8,054,398 B2* | 11/2011 | Kim et al. | | 349/48 |
| 2005/0280763 A1* | 12/2005 | Kang et al. | | 349/141 |
| 2008/0024689 A1* | 1/2008 | Ahn | | 349/43 |
| 2011/0025923 A1* | 2/2011 | Tsubata | | 348/731 |

* cited by examiner

*Primary Examiner* — Muhammad N Edun
(74) *Attorney, Agent, or Firm* — Innovation Counsel LLP

(57) ABSTRACT

A thin-film transistor display panel according to one or more embodiments is provided. According to an embodiment, a thin-film transistor display panel includes an insulation substrate, a gate line that is formed on the insulation substrate and is extended in a first direction, a first data line and a second data line that cross with the first gate line, and are respectively extended side by side in a second direction, a first switching element that is electrically connected to the gate line and the first data line, a second switching element that is electrically connected to the gate line and the second data line, a first pixel electrode that is connected to the first switching element, and is at least partly overlapped with the gate line of the front end, a second pixel electrode that is connected to the second switching element, and is arranged with the first pixel electrode side by side, and a storage line that is at least partly overlapped with the first pixel electrode and the second pixel electrode by being formed with the gate line side by side and being formed at both sides of the first pixel electrode and the second pixel electrode.

15 Claims, 8 Drawing Sheets

THIN FILM TRANSISTOR DISPLAY PANEL

CROSS-REFERENCE TO RELATED APPLICATION

This application claims priority and benefit from Korean Patent Application No. 10-2009-0020754 filed on Mar. 11, 2009 in the Korean Intellectual Property Office, the disclosure of which is incorporated herein by reference in its entirety.

BACKGROUND

1. Technical Field

Embodiments of the present disclosure generally relate to methods and apparatuses for a thin-film transistor display panel. More particularly, embodiments of the present disclosure relate to a thin-film transistor display panel capable of providing uniform and good images by reducing the luminance difference of each pixel.

2. Description of the Related Art

As modern society becomes a highly information-oriented society, there is an increasing need for larger and thinner display devices, so there is a rapidly-increasing demand for FPDs (flat panel displays) such as PDPs (plasma display panels), PALCs (plasma address liquid crystal display panels), LCDs (liquid crystal displays), and OLEDs (organic light emitting diodes).

The LCD is currently one of the most widely used FPDs, and comprises two boards having electrodes, and a liquid crystal layer inserted between the boards. The LCD is a device that displays images by regulating the amount of transmitted light by rearranging liquid crystal molecules of the liquid crystal layer by authorizing (supplying) voltage to the electrode.

The LCD displays images by collecting light emitted from each pixel arranged in a matrix type. In order to get good images, various structures, which have transformed shapes of each pixel or operating methods in various manners, have been developed. Likewise, in order to change shapes of each pixel or operating methods, shapes of each pixel electrode can be changed in various manners, and gate lines and arrangement methods of data lines can be changed in various forms.

Likewise, a thin-film transistor display panel, where a thin-film transistor array has been formed, can have differences in the opening rate of each pixel, depending on the arrangement method of shapes of the pixel electrode, gate lines and data lines. The opening rate difference in each pixel makes it impossible to provide uniform images by generating differences in luminance for each pixel.

Further, electrodes of each pixel generate couplings between adjacent devices, and differences in capacitance by such a coupling makes it impossible for each pixel to generate uniform luminance.

SUMMARY

Embodiments of the present invention provide a thin-film transistor display panel capable of providing uniform and good images by reducing the luminance difference of each pixel.

Embodiments of the present invention will be more definitely understood by those in the art from the following detailed description.

According to an exemplary embodiment of the present invention, there is provided a thin-film transistor display panel including an insulation substrate, a gate line that is formed on the insulation substrate and is extended in a first direction, a first data line and a second data line that cross with the first gate line, and are respectively extended side by side in a second direction, a first switching element that is electrically connected to the gate line and the first data line, a second switching element that is electrically connected to the gate line and the second data line, a first pixel electrode that is connected to the first switching element, and is at least partly overlapped with a previous gate line, a second pixel electrode that is connected to the second switching element, and is arranged with the first pixel electrode side by side, and a storage line that is at least partly overlapped with the first pixel electrode and the second pixel electrode by being formed with the gate line side by side and being formed at both sides of the first pixel electrode and the second pixel electrode.

According to an exemplary embodiment of the present invention, there is provided a thin-film transistor display panel including an insulation film, a first gate line and a second gate line that are formed in a first direction side by side where the same gate signal is authorized, a first data line and a second data line that cross with the first gate line and the second gate line, and are extended side by side in a second direction, a first switching element that is electrically connected to the first gate line and the first data line, a second switching element that is electrically connected to the first gate line and the second data line, a first pixel electrode that is connected to the first switching element, and is at least partly overlapped with a previous first gate line, a second pixel electrode that is connected to the second switching element, and is at least partly overlapped with the second gate line, and a storage line that is formed with the first and second gate lines side by side, is formed at both sides of the first pixel electrode and the second pixel electrode, and is at least partly overlapped with the first pixel electrode and the second pixel electrode.

BRIEF DESCRIPTION OF THE DRAWINGS

The above and other features and advantages of the present disclosure will become apparent by describing in detail embodiments thereof with reference to the attached drawings in which.

DETAILED DESCRIPTION

Exemplary embodiments of the present invention will be described in detail with reference to the accompanying drawings.

Advantages and features of the present disclosure of invention may be understood more readily by reference to the following detailed description of the exemplary embodiments and the accompanying drawings. The teachings of the present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art.

It will be understood that when an element or layer is referred to as being "on", "connected to", or "coupled to" another element or layer, it can be directly on, directly connected to, or directly coupled to the other element or layer, or intervening elements or layers may be present. In contrast, when an element is referred to as being "directly on," "directly connected to", or "directly coupled to" another element or layer, there are no intervening elements or layers present. Like numbers refer to like elements throughout. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Embodiments of the present invention are described herein with reference to cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region and are not intended to limit the scope of the present invention.

Hereinafter, a thin-film transistor display panel according to an exemplary embodiment of the present invention will be described with reference to FIGS. 1 to 5.

Figure 1:
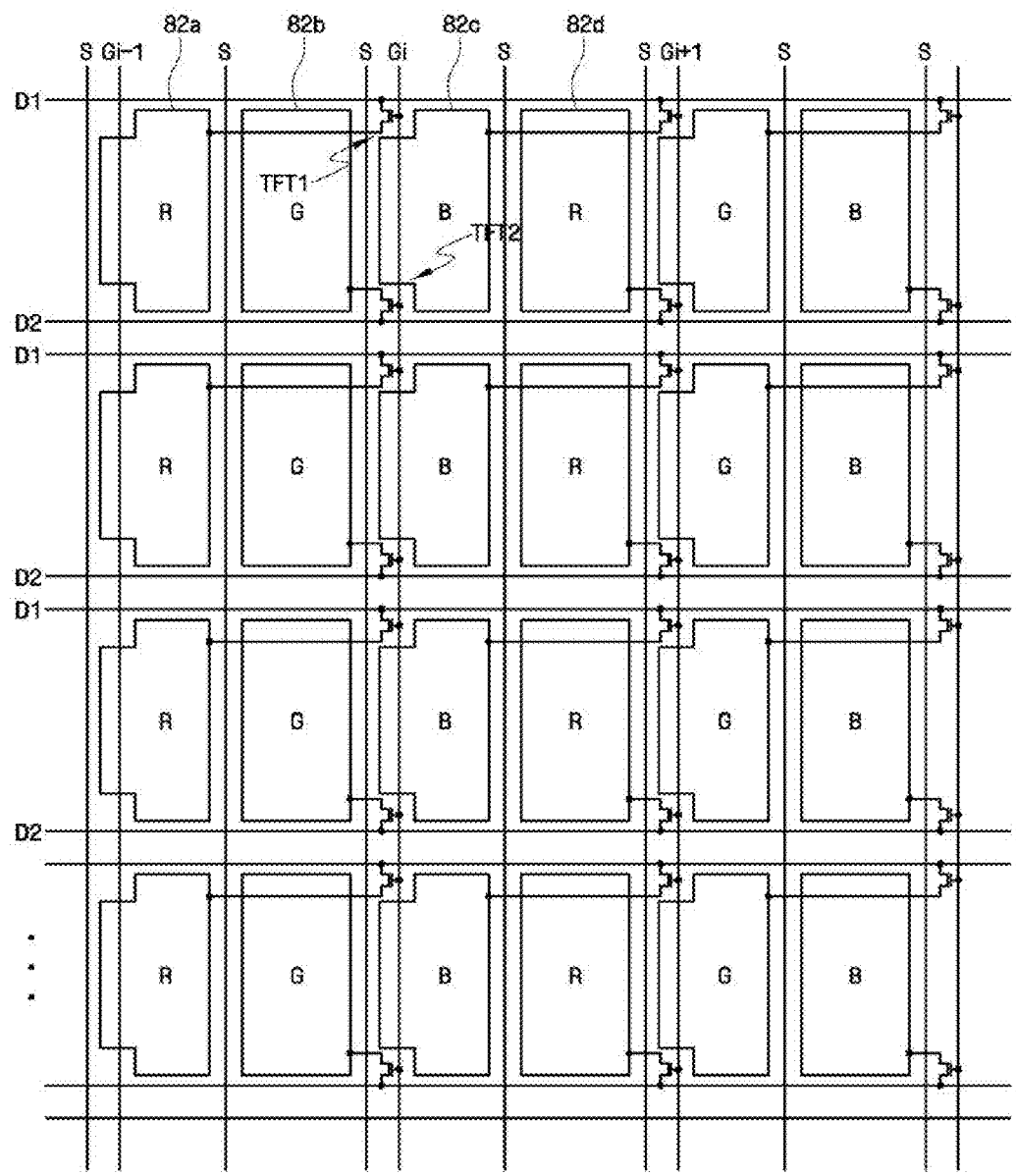
FIG. 1 is a sketch of a circuit diagram of a thin-film transistor display panel according to an exemplary embodiment of the present invention.

Referring to FIG. 1, FIG. 1 is a sketch of a circuit diagram of a thin-film transistor display panel according to an exemplary embodiment of the present invention.

The thin-film transistor display panel according to an exemplary embodiment of the present invention has a structure where two pixels are defined by one gate line Gi and two data lines D1 and D2.

Specifically, the gate line Gi-1, Gi and Gi+1 is extended in a first direction, and the first data line D1 and the second data line D2 are extended side by side in a second direction. The thin-film transistor display panel 2 (also illustrated in FIG. 3) includes a plurality of gate lines Gi-1, Gi and Gi+1 and a plurality of first data lines D1 and second date lines D2.

First pixel electrodes 82a and 82c and second pixel electrodes 82b and 82d may be formed between each gate line Gi-1, Gi and Gi+1. The gate line Gi may control the first pixel electrode 82a and the second pixel electrode 82b, respectively, through a first switching element TFT1 and a second switching element TFT2.

The first switching element TFT1 is electrically connected to the first data line D1 and the gate line Gi, and authorizes data signals to the first pixel electrode 82a. The second switching element TFT2 is electrically connected to the second data line D2 and the gate line Gi, and authorizes data signals to the second pixel electrode 82b. The first switching element TFT1 and the second switching element TFT2 are connected to the same gate line Gi, and the first pixel electrode 82a and the second pixel electrode 82b may be operated at the same time.

Here, the first pixel electrode 82a may be formed in such a manner that at least a portion is overlapped with a previous gate line Gi-1. The previous gate line Gi-1 may partly play the role of the storage capacitor of the first pixel electrode 82a.

The first direction, to which the gate line Gi is extended, may be the short-side direction of the thin-film transistor display panel 2, and the second direction, to which the first data line D1 and the second data line D2 are extended, may be the long-side direction of the thin-film transistor display panel 2. Hence, the gate signal may be gradually authorized along the second direction.

Further, the first pixel electrode 82a and the second pixel electrode 82b are arranged in parallel to the gate line Gi. The first switching element TFT1 crosses the first pixel electrode 82a, and authorizes data signals to the first pixel electrode. The second switching element TFT2 authorizes data signals to the adjacent second pixel electrode 82b.

A storage line S is formed between the first pixel electrode 82a and the second pixel electrode 82b. At least a portion of the storage line S is overlapped with the first pixel electrode 82a and the second pixel electrode 82b, and may be formed at both sides of the first pixel electrode 82a and the second pixel electrode 82b, respectively.

Figure 2:
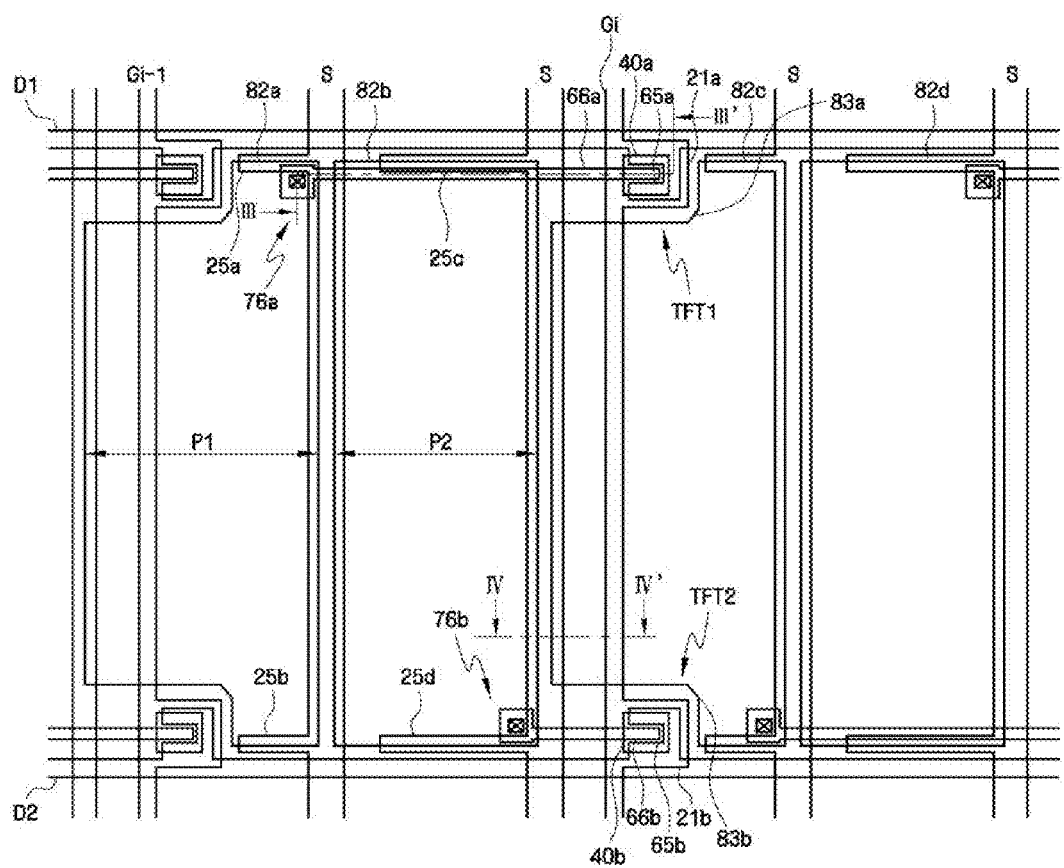
FIG. 2 is an arrangement diagram of a display panel including the thin-film transistor display panel of FIG. 1 according to an embodiment.
Figure 3:
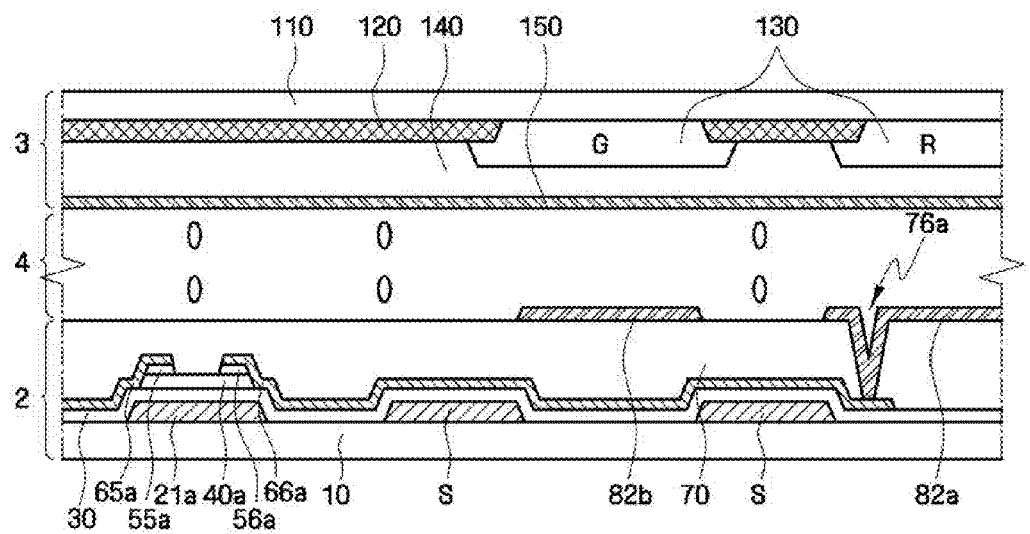
FIG. 3 is a sectional diagram of the display panel of FIG. 2 by III-III' line according to an embodiment.
Figure 4:
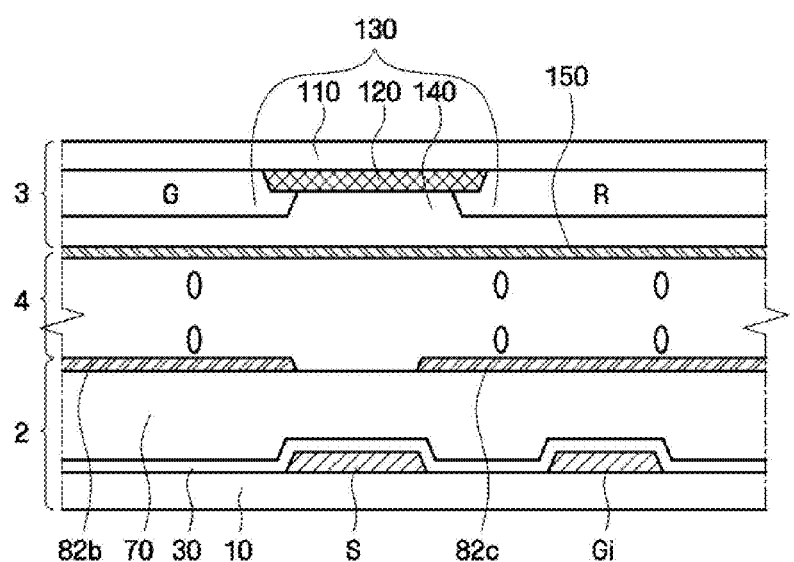
FIG. 4. is a sectional diagram of the display panel of FIG. 2 by IV-IV' line according to an embodiment.

Referring to FIGS. 2 to 4, the structure of the thin-film transistor panel according to an exemplary embodiment of the present invention is explained in detail. FIG. 2 is an arrangement diagram of a display panel including the thin-film transistor display panel of FIG. 1 according to an embodiment. FIG. 3 is a sectional diagram of the display panel of FIG. 2 by III-III' line. FIG. 4. is a sectional diagram of the display panel of FIG. 2 by IV-IV' line.

First, referring to FIGS. 2 and 3, Gate lines Gi-1 and Gi, which are formed on a first insulation substrate 10, are mainly extended in the first direction, and transmit gate signals. Here, in this embodiment, the first insulation substrate 10 may be formed in a rectangular form, and the short side of the first insulation substrate 10 may be a first direction.

One of the gate lines Gi-1 and Gi is allocated for each of the two pixels. That is, the first switching element TFT1 and the second switching element TFT2, which may authorize data signals to the first pixel electrode 82a and the second pixel electrode 82b, are connected to one gate line Gi. Hence, the projected first gate electrode 21a and the second gate electrode 21b are formed at the gate line Gi. Such gate line Gi, the first gate electrode 21a and the second gate electrode 21b may be called a gate wiring.

The gate wiring may consist of, for example, aluminum series metal such as aluminum (Al) and aluminum alloys, silver series metal such as silver (Ag) and silver alloys, copper series metal such as copper (Cu) and copper alloys, molybdenum series metal such as molybdenum (Mo) and molybdenum alloys, chrome (Cr), titanium (Ti), and tantalum (Ta). Further, the gate wiring may have a multi-layer structure that contains two different conductive layers (not shown) having different physical attributes. Here, one conductive layer may consist of a metal having low resistivity such as aluminum series metal, silver series metal and copper series metal in order to reduce the signal delay or voltage drop of the gate wiring. On the other hand, the other conductive layer may consist of materials having good contact features with ITO (indium tin oxide) and IZO (indium zinc oxide) such as molybdenum series metal, chrome, titanium and tantalum. Some examples of such a combination include a lower layer of chrome and an upper layer of aluminum, and a lower layer of aluminum and an upper layer of molybdenum. However, embodiments of the present invention are not limited to these examples, and the gate wiring may be made by various metals and conductors.

Further, a storage line S is formed between gate lines Gi−1 and Gi. The storage line S is formed side by side with the gate line Gi, and forms a storage capacitor with the first pixel electrode 82a and the second pixel electrode 82b. Such a storage line S includes a storage electrode 25a, 25b, 25c and 25d extended in parallel with the first data line D1 and the second data line D2.

A gate insulation film 30, which may be made of, for example, silicon nitride (SiNx), etc. is formed on the gate lines Gi−1 and Gi and the storage line S.

A first active layer 40a and a second active layer 40b consisting of, for example, hydrogenated amorphous silicon or polycystal silicon are formed on the gate insulation film 30. The first active layer 40a and the second active layer 40b are formed to be overlapped with the first gate electrode 21a and the second gate electrode 21b, respectively.

Ohmic contact layers 55a and 56a may be made of materials such as silicide and n+ hydrogenated amorphous silicon where n-type impurities are doped. The ohmic contact layers 55a and 56a form a pair, and are positioned at the first active layer 40a and the second active layer 40b.

A first source electrode 65a and a second source electrode 65b, and a first drain electrode 66a and a second drain electrode 66b respectively corresponding to the first source electrode 65a and the second source electrode 65b are formed on the ohmic contact layers 55a and 56a.

The first line D1 and the second data line D2 are formed side by side with each other, and are extended in a second direction crossing with the gate line Gi. The second direction may be a direction in parallel with the long-side direction of the first insulation substrate 10.

The first data line D1 and the second data line D2 transmit data signals to the first pixel electrode 82a and the second pixel electrode 82b, respectively. The gate lines Gi−1 and Gi, the first data line D1 and the second data line D2 are insulated by the gate insulation film 30, respectively.

The first source electrode 65a and the second source electrode 65b are branched out of the first data line D1 and the second data line D2 to be formed. Such first data line D1, the second data line D2, the first source electrode 65a, the second source electrode 65b, the first drain electrode 66a and the second drain electrode 66b may be called data wiring.

The data wiring may be made of fire-resistant metal such as chrome molybdenum series metal, tantalum and titanium, and it is possible to have a multi-layer structure consisting of a lower layer (not shown) of fire-resistant metal and an upper layer (not shown) of low-resistance material. Some examples of the multi-layer structure include a dual layer such as a chrome lower layer and an aluminum upper layer, an aluminum lower layer and a molybdenum upper layer, and a triple layer such as a molybdenum-aluminum-molybdenum layer.

The first active layer 40a is overlapped with the first source electrode 65a and the first drain electrode 66a, and a channel is formed between the first source electrode 65a and the first drain electrode 66a. Further, the active layer 40b is overlapped with the first source electrode 65b and the second drain electrode 66b, and a channel is formed between the second source electrode 65b and the second drain electrode 66b.

A passivation layer 70 is formed on the first active layer and the second active layer 40b. The passivation layer 70 may consist of inorganic matters made of, for example, silicon nitride or silicon oxide, organic matters having good planarization attributes and photosensitivity, and insulation materials with a low dielectric constant such as a-Si:C:O and a-Si:O:F formed by plasma enhanced chemical vapor deposition (PECVD). Further, the passivation layer 70 may have a dual-layer structure of a lower inorganic layer and an upper organic layer in order to protect the exposed first active layer 40a and the second active layer 40b while highlighting good features of the organic layer. Further, red, green or blue color filter layers may be used as a protective layer 70.

Contact holes 55a and 55b are formed at the protective layer 70. The first pixel electrode 82a and the second pixel electrode 82b, which may be made of transparent electrodes such as ITO or IZO, are formed on the protective layer 70.

The first pixel electrode 82a is connected to the gate line Gi and the first data line D1 via the first switching element TFT1, and is authorized data signals. The second pixel electrode 82B is connected to the gate line Gi and the second data line D2, and is authorized data signals. Here, the first switching element TFT1 and the second switching element TFT2 may be a thin-film transistor. That is, the first switching element TFT1 may be a thin-film transistor that has the first gate electrode 21a, the second source electrode 65a and the first drain electrode 66a as three terminals, and the second switching element TFT2 may be a thin-film transistor that has the second gate electrode 21b, the second source electrode 65b and the second drain electrode 66b as the three terminals.

The first pixel electrode 82a and the second pixel electrode 82b may be formed long in the first direction along the gate lines Gi−1 and Gi. That is, the width of the first direction of the first pixel electrode 82a and the second pixel electrode 82b may be formed wider than that of the second direction. Such a first pixel electrode 82a and a second pixel electrode 82b may be formed in parallel along the first direction. That is, the first pixel electrode 82a and the second pixel electrode 82b may be arranged side by side with the gate lines Gi−1 and Gi.

Further, the first pixel electrode 82a may be at least partly overlapped with the previous gate line Gi−1, and the gate line Gi may be at least partly overlapped with the first pixel electrode 82c of the rear end adjacent with the second pixel electrode 82b. That is, the first pixel electrode 82a and second pixel electrode 82b are repeatedly formed along the first data line D1 and the second data line D2. Hence, the second pixel electrode 82b is substantially the same as the first pixel electrode 82c of the rear end adjacent to the second pixel electrode 82b, and the second pixel electrode 82b is substantially the same as the second pixel electrode 82d adjacent to the first pixel electrode 82a.

The first switching element TFT1 and the second switching element TFT2 may be formed at the indented portions 83a and 83b formed at the first pixel electrode 82c of the adjacent rear end. Hence, the first pixel electrode 82a is connected through the first drain electrode 66a and the first contact hole 76a of the first switching element TFT1. Here, the first drain electrode 66a passes through the second pixel electrode 82b, and is connected to the first pixel electrode 82a. That is, the first drain electrode 66a may be partly overlapped with the second pixel electrode 82b.

In contrast, the second pixel electrode 82b may be directly connected to the second drain electrode 66b of the second switching element TFT2.

The area of the first pixel electrode except the storage line S, the storage electrodes 25a, 25b, 25c and 25d, and the previous gate line Gi−1, which are overlapped with the first pixel electrode 82a, may be substantially the same as the area of the second pixel electrode 82b except the storage line, the storage electrodes 25a, 25b, 25c and 25d, and the drain electrode 66a. That is, the area except the area overlapped with the opaque material such as the storage line S or the gate lines Gi−1 and Gi is an area where the light is emitted, and affects the luminance of each pixel, so the luminance deviation of each pixel may be reduced.

Likewise, the width P1 of the first pixel electrode 82a and the width P2 of the second pixel electrode 82b may be adjusted as a way to adjust the transmitting area of the first pixel electrode 82a and the second pixel electrode in the same manner. For example, the width of the first pixel electrode 82a overlapped with the previous gate line Gi−1 may be formed larger than that of the second pixel electrode 82b.

Referring to FIGS. 2 and 4, the storage line S is formed at both sides of the first pixel electrode 82a and the second pixel electrodes. At least a portion is overlapped with both sides of the first pixel electrode 82a and the second pixel electrode 82b, thereby forming the storage capacitor. Here, in order to strengthen an insufficient storage capacitor, storage electrodes 25a, 25b, 25c and 25d extended along the first data line D1 and the second data line D2 may be included. The storage electrodes 25a, 25b, 25c and 25d are branched out of the storage line S, and the width of the storage electrode S may be adjusted to regulate the storage capacitor.

Figure 5:
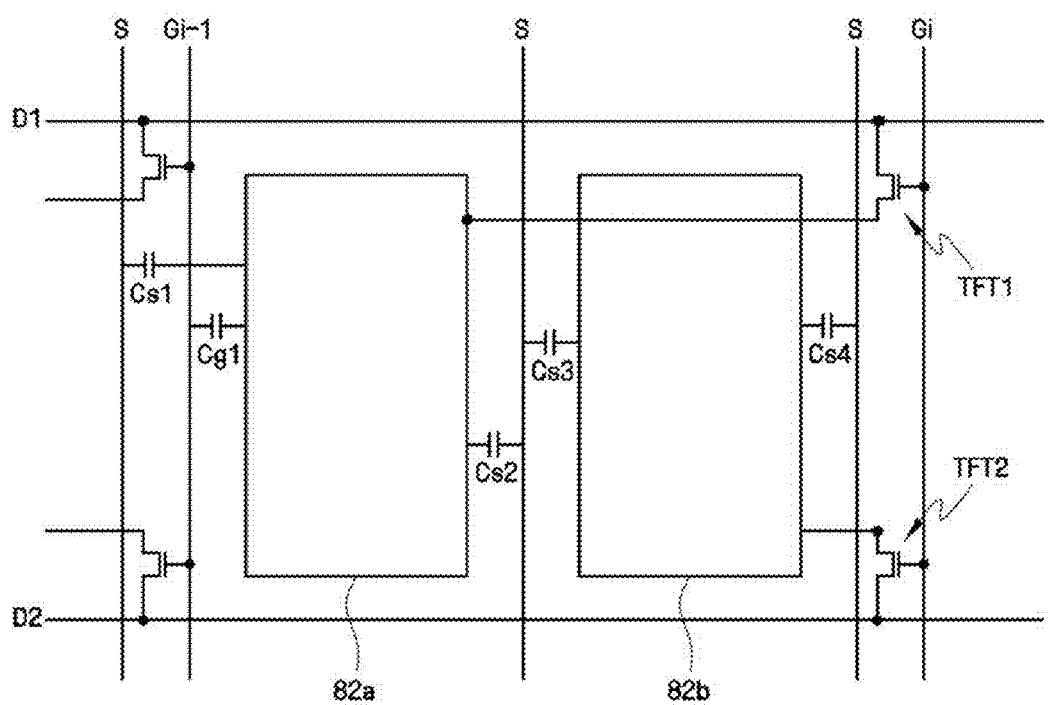
FIG. 5 is an equivalent circuit diagram of a thin-film transistor display panel included in the display panel of FIG. 1 according to an embodiment.

FIG. 5 is an equivalent circuit diagram of a thin-film transistor display panel included in the display panel of FIG. 1 according to an embodiment.

Referring to FIG. 5, the first pixel electrode 82a and the second pixel electrode 82b form a capacitance with the gate lines Gi−1 and a previous storage line S. Such a capacitance may change the value of the voltage charged in the first pixel electrode 82a and the second pixel electrode 82b, thereby affecting the image quality.

The capacitance between the first pixel electrode 82a, the storage line S and the previous gate line Gi−1 may be formed in the same manner with the capacitance between the second pixel electrode 82b and the storage line S.

A first storage capacitor Cs1 and a second storage capacitor Cs2 are formed between the first pixel electrode 82a and the storage line S, and a gate capacitor Cg1 is formed between the first pixel electrode 82a and the previous gate line Gi−1.

A third storage capacitor Cs3 and a fourth storage capacitor Cs4 are formed between the second pixel electrode 82b and the storage line S.

In order for the first pixel electrode 82a and the second pixel electrode 82b to have a deviation of luminance, the sum total of the gate capacitor Cg1 and the first and second storage capacitors Cs1 and Cs2 of the first pixel electrode 82a may be the same as the sum total of the gate capacitor Cg1 and the first and second storage capacitors Cs1 and Cs2 of the first pixel electrode 82a.

The upper display panel 3 is explained with reference to FIG. 3 according to an embodiment. A black matrix 120 that prevents shining of light and defines the pixel region is formed on the second insulation substrate 110 made of, for example, transparent glass, etc. The black matrix 120 may be formed at the portion corresponding to the first data line D1 and the second data line D2, and the portion corresponding to a thin-film transistor. The black matrix 120 may consist of metal such as chrome and chrome oxide, or organic black resist.

Further, a color filter 130 of red, green and blue colors may be gradually arranged in the pixel region between the black matrix 120.

An overcoat layer 140 for planarizing the differences may be formed on the color filter.

A common electrode 150 consisting of transparent conductive materials such as ITO or IZO is formed on the overcoat layer 140. The common electrode 150 is arranged, facing with the first pixel electrode 82a and the second pixel electrode 82b, and a liquid layer 4 is interposed between the common electrode 150 and the first pixel electrode 82a and the second pixel electrode 82b.

The basic structure of a display apparatus according to an embodiment is made by arranging and combining a thin-film transistor display panel 2 and an upper display panel 3 of such a structure, and forming a liquid crystal layer 4 by injecting liquid crystal material.

Figure 6:
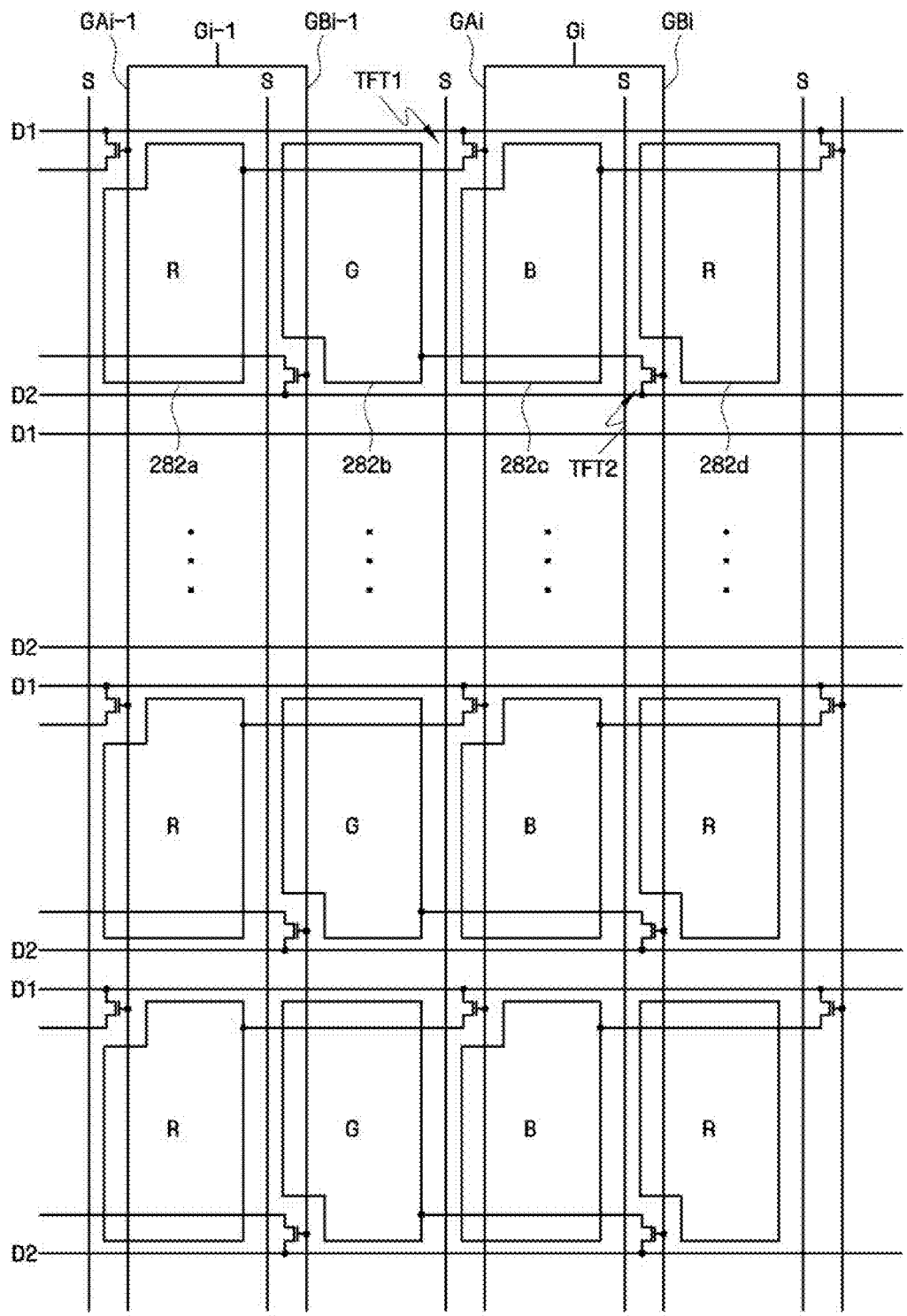
FIG. 6 is a sketch of a circuit diagram of a thin-film transistor display panel according to another exemplary embodiment of the present invention.
Figure 7:
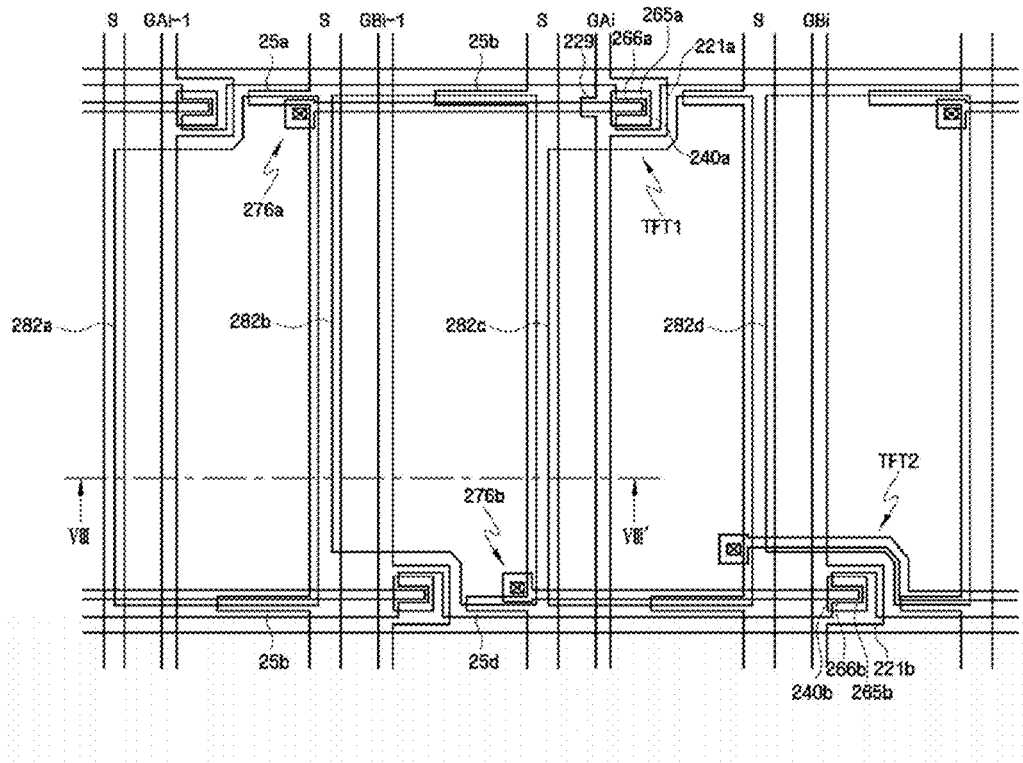
FIG. 7 is an arrangement diagram of the thin-film transistor display panel of FIG. 6 according to an embodiment.
Figure 8A:
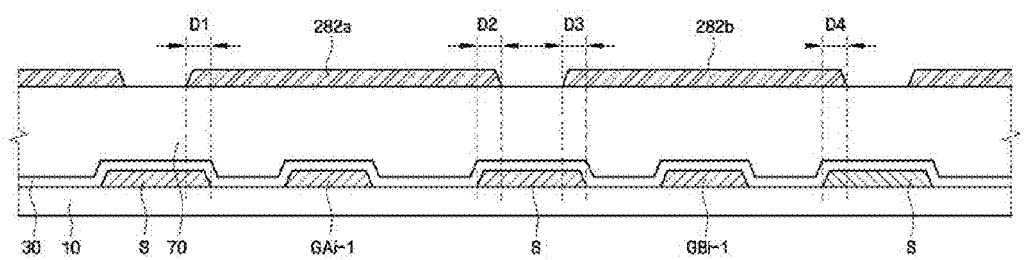
FIG. 8A is a sectional diagram of the thin-film transistor display panel of FIG. 7 by line VIII-VIII' according to an embodiment.
Figure 8B:
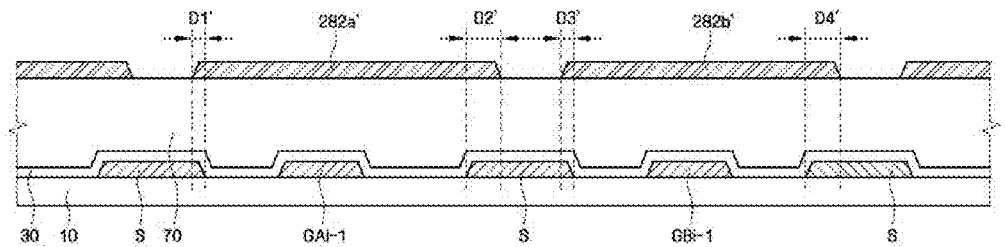
FIG. 8B is a sectional diagram of a thin-film transistor display panel where there is a process deviation.

A thin-film transistor display panel is explained in detail according to another exemplary embodiment of the present invention with reference to FIGS. 6 to 8b. FIG. 6 is a sketch of a circuit diagram of a thin-film transistor display panel according to another exemplary embodiment of the present invention. FIG. 7 is an arrangement diagram of the thin-film transistor display panel of FIG. 6. FIG. 8A is a sectional diagram of the thin-film transistor display panel of FIG. 7 by line VIII-VIII'. FIG. 8B is a sectional diagram of a thin-film transistor display panel where there is a process deviation.

A thin-film transistor display panel according to another exemplary embodiment of the present invention includes a first gate line GAi and a second gate line GBi that authorize gate signals to the first pixel electrode 282a and the second pixel electrode 282b, respectively. Here, the same gate signals may be authorized to the first gate line GAi and the second gate line GBi.

First, referring to FIG. 6, first gate lines GAi−1 and GAi and second gate lines GBi−1 and GBi are extended in a first direction, and the first data line D1 and the second data line D2 are extended side by side in a second direction. The first gate lines GAi−1 and GAi and the second gate lines GBi−1 and GBi are connected to one main gate line Gi−1 and Gi. The thin-film transistor display panel 2 includes a plurality of main gate lines Gi−1 and Gi and a plurality of first gate lines D1 and second gate lines D2.

The first pixel electrode 282a and the second pixel electrode 282b may be formed between the first gate lines GAi−1 and GAi and the second gate line GBi−1 and GBi. The first gate line GAi and the second gate line GBi may control the first pixel electrode 282a and the second pixel electrode 282b, respectively, through the first switching element TFT1 and the second switching element TFT2.

The first switching element TFT1 is electrically connected to the first data line D1 and the first gate line GAi, and authorizes data signals to the first pixel electrode 282a. The second switching element TFT2 is electrically connected to the first data line D2 and the second gate line GBi, and authorizes data signals to the second pixel electrode 282b. The first switching element TFT1 and the second switching element TFT2 are connected to the same main gate lines Gi−1 and Gi, so the first pixel electrode 282a and the second pixel electrode 282b may be operated at the same time.

Here, the first pixel electrode 282a and the second pixel electrode 282b may be formed in such a manner that they are at least partly overlapped with the previous gate lines GAi−1 and GBi−1. The previous gate lines GAi−1 and GBi−1 may partly play the role of a storage capacitor of the first pixel electrode 282a and the second pixel electrode 282b.

The first direction where the first gate lines GAi−1 and GAi and the second gate lines GBi−1 and GBi are extended may be a short-side direction of the thin-film transistor display panel 2, and the second direction where the first data line D1 and the second data line D2 are extended may be a long-side direction of the thin-film transistor display panel 2. Hence, the gate signals may be gradually authorized along the second direction.

Further, the first pixel electrode 282a and the second pixel electrode 282b are arranged in parallel with the first gate line GAi and the second gate line GBi. The first switching element TFT1 traverses the second pixel electrode 282b, and authorizes data signals to the first pixel electrode 282a, and the second switching element TFT2 traverses the first pixel electrode 282C of the adjacent rear end, and authorizes data signals.

Storage electrodes 25a, 25b, 25c and 25d are formed between the first pixel electrode 282a and the second pixel electrode 282b. At least a portion of the storage electrodes 25a, 25b, 25c and 25d is at least partly overlapped with the first pixel electrode 282a and the second pixel electrode 282b, and may be formed at both sides of the first pixel electrode 282a and the second pixel electrode 282b, respectively.

Referring to FIG. 7, the first gate lines GAi−1 and GAi and the second gate lines GBi−1 and GBi, which are mainly extended in a first direction and transmit gate signals, are formed on the first insulation substrate 10. The first gate lines GAi−1 and GAi and the second gate line GBi−1 are respectively allocated to one pixel, and the same gate signal is authorized to the first gate lines GAi−1 and GAi and the second gate lines GBi−1 and GBi.

A projected first gate electrode 221a and a projected second gate electrode 221b are formed at the first gate lines GAi−1 and GAi and the second gate lines GBi−1 and GBi. Such first gate lines GAi−1 and GAi and second gate lines GBi−1 and GBi, and the first gate electrode 221a and the second gate electrode 221b may be called gate wiring.

Further, a storage lines S is formed between the first gate lines GAi−1 and GAi and the second gate lines GBi−1 and GBi. The storage line S is formed side by side with the first gate lines GAi−1 and GAi and the second gate lines GBi−1 and GBi, and also the first pixel electrode 282a, the second pixel electrode 282b and the storage capacitor are formed. Such a storage line S includes storage electrodes 25a, 25b, 25c and 25d extended in parallel with the first data line D1 and the second data line D2.

The first switching element TFT1 connected through the first pixel electrode 282a and the first contact hole 276a has the first gate electrode 221a, the first source electrode 265a and the first drain electrode 266a as three terminals, and may be formed as a thin-film transistor that includes the first active layer 240a.

Further, the second switching element TFT2 connected through the second pixel electrode 282b and the second contact hole 276b uses the second gate electrode 221b, the second source electrode 265b and the second drain electrode 266b as three terminals, and may also be formed as a thin-film transistor that includes the second active layer 240b.

The first pixel electrode 282a and the second pixel electrode 282b are formed in such a manner that they are respectively overlapped with the previous first gate line GAi−1 and the previous second gate line GBi−1. Hence, unlike the previous embodiment, the width of the first pixel electrode 282a may be formed substantially the same as that of the second pixel electrode 282b.

The first pixel electrode 282a and the second pixel electrode 282b are repeatedly formed along the first data line D1 and the second data line D2. Hence, the first pixel electrode 282a is substantially the same as the first pixel electrode 282c of the rear end adjacent to the second pixel electrode 282b, and the second pixel electrode 282b is substantially the same as the second pixel electrode 282d of the rear end adjacent to the first pixel electrode 282c of the rear end.

Further, the drain electrode 266b of the second switching element TFT2 is partly overlapped with the first gate lines GAi−1 and GAi. Hence, the storage capacitance of the second pixel electrode 282b may increase to some extent. In order to compensate for such a difference of the storage capacitance, the overlapped region of the first switching element TFT1 and the first gate line GAi may be increased. Hence, a projected electrode projected along the first drain electrode 266a may be formed in the first gate line GAi. Such a projected electrode 229 is overlapped with the first drain electrode 266a, and forms a storage capacitor.

Next, referring to FIGS. 8a and 8b, a change in capacitance according to the process difference is explained.

First, referring to FIG. 8a, the first pixel electrode 282a and the second pixel electrode 282b are overlapped with the storage line S to some extent. Specifically, the first pixel electrode 282a is overlapped at both sides by as much as D1 and D2, and the second pixel electrode 282b is overlapped at both sides as much as D3 and D4.

The thin-film transistor display panel illustrated in FIG. 8a does not generate a process difference, and D1, D2, D3 and D4 form overlapped regions as much as respectively designed.

Next, referring to 8b, changes in capacitance between the first pixel electrode 282a and the second pixel electrode 282b and the storage line S when there is a process deviation in the process of manufacturing a thin-film transistor are explained.

The first pixel electrode 282a and the second pixel electrode 282b may be formed in a manner that is quite deviated from the storage line S by a process deviation. Here, the overlapped width of the first pixel electrode 282a and the storage line S becomes D1' and D2', and the overlapped width of the second pixel electrode 282b and the storage line S becomes D3' and D4'.

If FIGS. 8A and 8B are compared, D1, D2, D3 and D4 become D1', D2', D3' and D4', respectively. The storage capacitor of the first pixel electrode 282a is substantially determined by the sum of D1 and D2 or the sum of D1' and D2'.

Further, the sum of D1 and D2 is substantially the same as that of D1' and D2', and the sum of D3 and D4 is substantially the same as that of D3' and D4'. Hence, if FIGS. 8A and 8B are compared, the thin-film transistor display panel according to another exemplary embodiment of the present invention does not have a capacitance difference between the first pixel electrode 282a and the second pixel electrode 282b and the storage line S.

Figure 9:
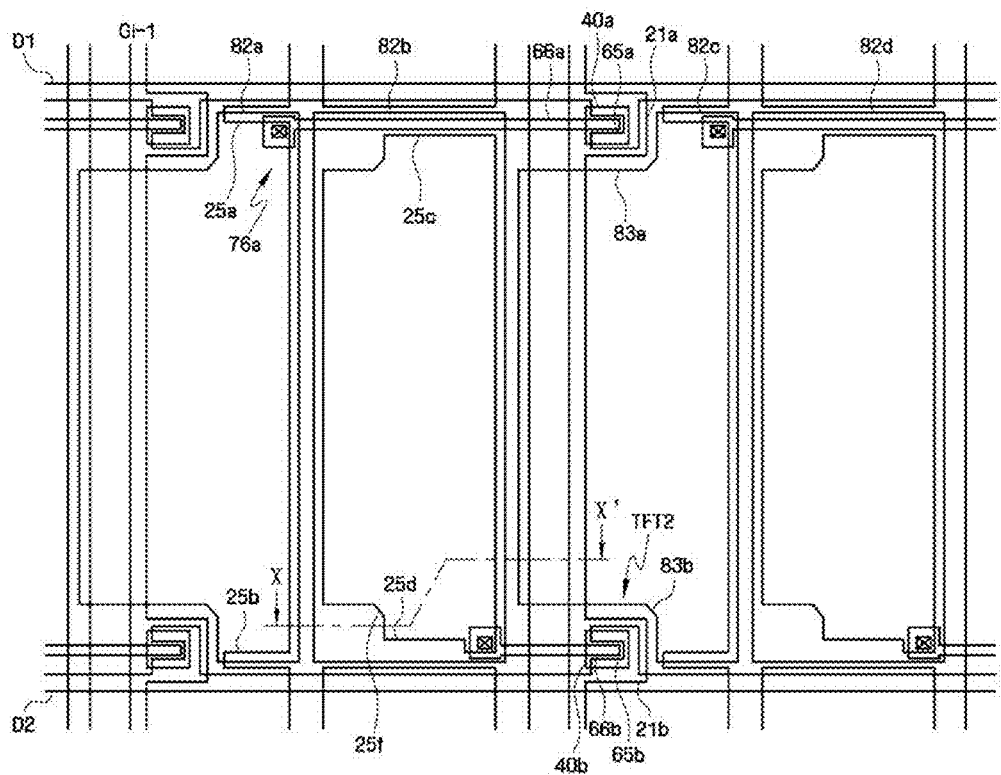
FIG. 9 is an arrangement diagram of a thin-film transistor display panel according to another exemplary embodiment of the present invention.
Figure 10:
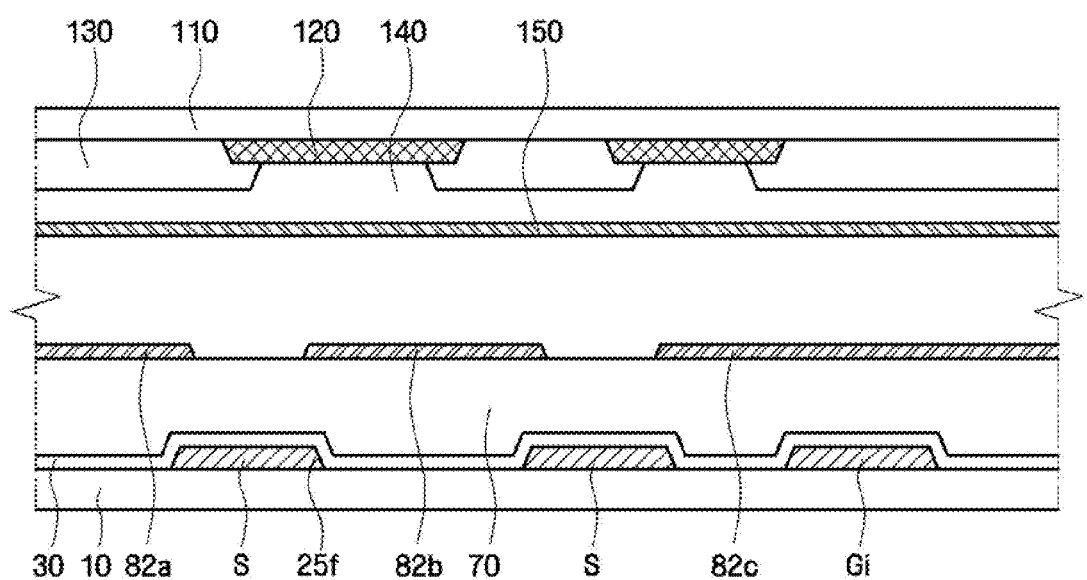
FIG. 10 is a sectional diagram of the thin-film transistor display panel of FIG. 9 by X-X' line according to an embodiment.

A thin-film transistor display panel according to further another exemplary embodiment of the present invention will be explained in the following with reference to FIGS. 9 and 10. FIG. 9 is an arrangement diagram of a thin-film transistor display panel according to another exemplary embodiment of the present invention. FIG. 10 is a sectional diagram of the thin-film transistor display panel of FIG. 9 by X-X' line.

The thin-film transistor display panel 2 according to the embodiment further includes a storage extension electrode 25f that is overlapped with the second pixel electrode 82b.

The gate lines Gi−1 and Gi are extended in a first direction, and the first data line D1 and the second data line D2 are extended in a second direction side by side. The thin-film transistor display panel 2 includes a plurality of gate lines Gi−1 and Gi and a plurality of first data lines D1 and second data lines D2.

The first pixel electrode 82a and the second pixel electrode 82b may be formed between each gate lines Gi. Each gate line Gi may control the first pixel electrode 82a and the second pixel electrode 82b through the first switching element TFT1 and the second switching element TFT2.

The first switching element TFT1 is electrically connected to the first data line D1 and the gate line Gi, and authorizes data signals to the first pixel electrode, and the second switching element TFT2 is electrically connected to the second data line D2 and the gate line Gi, and authorizes data signals to the second pixel electrode 82b. The first switching element TFT1 and the second switching element TFT2 are connected to the same gate line Gi, so the first pixel electrode 82a and the second pixel electrode 82b may be operated at the same time.

Here, the first pixel electrode 82a may be formed in a manner that is at least partly overlapped with the previous gate line Gi−1. The previous gate line Gi−1 may play the role of a storage capacitor of the first pixel electrode 82a.

Further, the first pixel electrode 82a and the second pixel electrode 82b are arranged in parallel with the gate line Gi. The first switching element TFT1 traverses the first pixel electrode 82a, and authorizes data signals to the first pixel electrode 82a, and the second switching element TFT2 authorizes data signals to the adjacent second pixel electrode 82b.

Storage electrodes 25a, 25b, 25c and 25d are formed between the first pixel electrode 82a and the second pixel electrode 82b. At least a portion of the storage electrodes 25a, 25b, 25c and 25d is overlapped with the first pixel electrode 82a and the second pixel electrode 82b, and may be formed at both sides of the first pixel electrode 82a and the second pixel electrode 82b.

In the first pixel electrode 82a, the storage capacitance may increase compared with the second pixel electrode 82b as the first pixel electrode 82a is at least partly overlapped with the previous gate line Gi−1.

Hence, in order to reduce such a difference of the storage capacitance, a storage extension electrode 25f that is overlapped with the second pixel electrode 82b and is extended from the storage line S is included.

The storage extension electrode 25f may be formed at the position of the second pixel electrode 82b corresponding to an indented portion formed at the first pixel electrode 82a. Likewise, the storage extension electrode 25f may regulate the transmitting area of the first pixel electrode 82a and the second pixel electrode 82b in the same manner by forming a position corresponding to the indented portions 83a and 83b of the first pixel electrode 82a.

Further, if an interval between the first pixel electrode 82a and the second pixel electrode 82b adjacent to the first pixel electrode 82a and the second pixel electrode 82b is increased, the coupling between adjacent pixels may be reduced. However, if the interval between each pixel is increased, the storage capacitance is reduced. Here, the storage capacitance may be adjusted through the width or the extended electrode 25f of the storage electrodes 25a, 25b, 25c and 25d.

It should be understood by those of ordinary skill in the art after reviewing the present disclosure that various replacements, modifications and changes may be made in the form and details without departing from the spirit and scope of the present teachings. Therefore, it is to be appreciated that the above described embodiments are for purposes of illustration only and are not to be construed as limitations of the disclosure.

What is claimed is:

1. A thin-film transistor display panel comprising:
an insulation substrate;
a first gate line among a sequence of gate lines, the first gate line and the other gate lines being formed on the insulation substrate and extended in a first direction;
a first data line and a second data line among a sequence of data lines which data lines each cross with the first gate line, where each of the first and second data lines respectively extends in an immediately side by side manner with a respective other of the data lines and in a second direction different from the first direction;
a first switching element that is electrically connected to the first gate line and the first data line;
a second switching element that is electrically connected to the first gate line and the second data line;
a first pixel electrode that is connected to the first switching element, and is at least partly overlapped with a previous gate line that precedes the first gate line in said sequence of gate lines;
a second pixel electrode that is connected to the second switching element, and is arranged with the first pixel electrode in an immediately side by side fashion; and
a storage lines network that is at least partly overlapped with the first pixel electrode and the second pixel electrode by being formed so as to include a first storage line extending in adjacent side by side relation with the first gate line and a second storage line extending in parallel with the first storage line, the storage lines network having its first and second storage lines disposed as a respective pair about both sides of the first pixel electrode and about both sides of the second pixel electrode so as to overlapping-wise sandwich each of the first and second pixel electrodes between that corresponding pair of storage lines.

2. The panel of claim 1, wherein a width in the second direction of the first pixel electrode is larger than a width in the second direction of the second pixel electrode.

3. The panel of claim 1, wherein the first switching element comprises a first gate electrode connected to the first gate line, a first source electrode connected to the first data line and a first drain electrode connected to the first pixel electrode forming a corresponding first thin-film transistor of three terminals, and wherein the first drain electrode extends to be at least partly overlapped with the second pixel electrode.

4. The panel of claim 3, wherein an area of the first pixel electrode is substantially the same as an area of the second pixel electrode.

5. The panel of claim 1, wherein a first storage capacitance defined by capacitance between the first pixel electrode and the storage lines network and the previous gate line is substantially the same as a second storage capacitance defined by capacitance between the second pixel electrode and the storage lines network.

6. The panel of claim 1, wherein the storage lines network includes a storage extension electrode that is extended in the second direction to capacitively overlap with the second pixel electrode.

7. The panel of claim 6, and further comprising a third pixel electrode disposed adjacent to the second pixel electrode, wherein the third pixel electrode further includes indented portions where the first switching element and the second switching element are arranged, and the storage lines network includes a storage extension electrode that is overlapped in the position corresponding to at least one of the indented portions.

8. A thin-film transistor display panel comprising:
an insulation film;
a first gate line and a second gate line that are formed to extend in spaced apart relation in a first direction side and coupled to be simultaneously energized by a same gate signal, the first and second gate lines being part of a sequence of other spaced apart and simultaneously energized gate line pairs including a previous gate line pair;
a first data line and a second data line among a sequence of data lines which data lines each cross with the first gate line and the second gate line, where each of the first and second data lines respectively extends in an immediately side by side manner with a respective other of the data lines and in a second direction different from the first direction;
a first switching element that is electrically connected to at least one of the first and second gate lines and is also connected to the first data line;
a second switching element that is electrically connected at least one of the first and second gate lines and is also connected to the second data line;
a first pixel electrode that is connected to the first switching element, and is at least partly overlapped with a respective first other gate line of the previous gate line pair;
a second pixel electrode that is connected to the second switching element, and is at least partly overlapped with a respective second other gate line of the previous gate line pair; and
a storage lines network having a plurality of storage lines that are formed in side by side relation with the first and second gate lines, the storage lines network including first and second storage lines respectively formed at opposed first and second sides of each of the first pixel electrode and the second pixel electrode, wherein each of the first and second storage lines is at least partly overlapped with the first pixel electrode and the second pixel electrode.

9. The panel of claim 8, wherein the storage lines network further includes a first storage electrode and a second storage electrode that are extended in the second direction and are overlapped with the first pixel electrode and the second pixel electrode, respectively, and a length of the first storage electrode is different from that of the second storage electrode.

10. The panel of claim 8, wherein the first switching element comprises a thin-film transistor that uses a gate electrode connected to the first gate line, a source electrode connected to the first data line, and a drain electrode connected to the first pixel electrode as three terminals, and the drain electrode is at least partly overlapped with the second pixel electrode.

11. The panel of claim 10, further comprising a projected electrode that is projected toward the first gate line and is overlapped with the drain electrode.

12. The panel of claim 11, wherein the projected electrode is projected as much as a width of the first gate line.

13. The panel of claim 8, wherein overlapped areas of the storage lines network and the first pixel electrode, where the overlapped areas are respectively arranged at both sides of the first pixel electrode, are different at both sides.

14. The panel of claim 8, wherein overlapped areas of the storage lines network and the second pixel electrode, where the overlapped areas are respectively arranged at both sides of the second pixel electrode are different at both sides.

15. The panel of claim 8, wherein a size of a first overlapped area of the first pixel electrode and the storage lines network respectively arranged at both sides of the first pixel electrode is substantially the same as that of a second overlapped area of the second pixel electrode and the storage lines network respectively arranged at both sides of the second pixel electrode.

* * * * *